United States Patent
Hwang et al.

(10) Patent No.: US 8,664,648 B2
(45) Date of Patent: Mar. 4, 2014

(54) N-TYPE ORGANIC THIN FILM TRANSISTOR, AMBIPOLAR FIELD-EFFECT TRANSISTOR, AND METHOD OF FABRICATING THE SAME

(75) Inventors: Jenn-Chang Hwang, Hsinchu (TW);
Li-Shiuan Tsai, Hsinchu (TW);
Chun-Yi Lee, Hsinchu (TW);
Cheng-Lun Tsai, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 150 days.

(21) Appl. No.: 13/425,284

(22) Filed: Mar. 20, 2012

(65) Prior Publication Data
US 2012/0175602 A1 Jul. 12, 2012

Related U.S. Application Data

(63) Continuation-in-part of application No. 12/841,678, filed on Jul. 22, 2010.

(30) Foreign Application Priority Data

Dec. 13, 2011 (TW) .............................. 100146057 A

(51) Int. Cl.
*H01L 35/24* (2006.01)
(52) U.S. Cl.
USPC ......... 257/40; 438/99; 257/E51.024; 257/347
(58) Field of Classification Search
USPC ................ 257/40, 59, 66, 72, 347, 350, 351, 257/E51.024; 438/99, 149, 151
See application file for complete search history.

(56) References Cited

U.S. PATENT DOCUMENTS 8,129,716 B2 * 3/2012 Hwang et al. .............. 257/40
2012/0175602 A1 * 7/2012 Hwang et al. .............. 257/40

OTHER PUBLICATIONS

Masatoshi Kitamura, Yasutaka Kuzumoto, Masakazu Kamura, Shigeru Aomori and Yasuhiko Arakawa, "High-performance fullerene $C_{60}$ thin-film transistors operating at low voltages" *Applied Physics Letters*; vol. 91; American Institute of Physics, Nov. 2, 2007.
Hagen Klauk, "Organic thin-film transistors" *Chemical Society Reviews*, 2010; p. 2643-2666; The Royal of Chemistry, Apr. 16, 2010.
Xiao-Hong Zhang and Bernard Kippelen, "High-performance $C_{60}$ n-channel organic field-effect transistors through optimization of interfaces" *Journal of Applied Physics*; 2008; vol. 41; American Institute of Physics, Nov. 20, 2008.

(Continued)

*Primary Examiner* — Jack Chen
(74) *Attorney, Agent, or Firm* — Muncy, Geissler, Olds & Lowe, P.C.

(57) ABSTRACT

An N-type organic thin film transistor, an ambipolar field-effect transistor, and methods of fabricating the same are disclosed. The N-type organic thin film transistor of the present invention comprises: a substrate; a gate electrode locating on the substrate; a gate-insulating layer covering the gate electrode, and the gate-insulating layer is made of silk protein; a buffering layer locating on the gate-insulating layer, and the buffering layer is made of pentacene; an N-type organic semiconductor layer locating on the buffering layer; and a source and a drain electrode, wherein the N-type organic semiconductor layer, the buffering layer, the source and the drain electrode are disposed over the gate dielectric layer.

10 Claims, 12 Drawing Sheets

(56) References Cited

OTHER PUBLICATIONS

Thomas D. Anthopoulos, Birendra Singh, Nenad Marjanovic, Niyiza S. Sariciftci, Alberto Mantaigne Ramil, Helmut Sitter, Michael Cölle and Dago M. de Leeuw, "High performance *n*-channel organic field-effect transistors and ring oscillators based on $C_{60}$ fullerene films" *Applied Physics Letters*; 2006; vol. 89; American Institute of Physics, Nov. 20, 2006.

P. Cossessu, A. Bonfiglio, I. Shalzmann, J.P. Rabe, N. Koch, "Ambipolar transport in transparent and flexible all-organic heterojunction field effect transistors at ambient conditions" *Organic Electronics*; 2008; vol. 9; p. 191-197; Elsevier, Nov. 22, 2007.

Junhyuk Jang, Ji Whan Kim, Nohhwal Park and Jang-Joo Kim, "Air stable $C_{60}$ based n-type organic field effect transistor using a perfluoropolymer insulator" *Organics Electronics*; 2008; vol. 9; p. 481-486; Elsevier, Feb. 29, 2008.

Kenji Itaka, Mitsugu Yamashiro, Jun Yamaguchi, Masamitsu Haemori, Seiichiro Yaginuma, Yuji Mastumoto, Michio Kondo and Hideomi Koinuma,"High-Mobility $C_{60}$ field effect-transistors fabricated on molecular-wetting controlled substrates" *Advanced Materials*; 2006; vol. 18; p. 1713-1716; Wiley-VCH Verlag GmbH & Co. KGaA.

Chung-Hwa Wang, Chao-Ying Hsieh and Jenn-Chang Hwang, "Flexible organic thin-film transistors with silk fibion as the gate dielectric" *Advanced Materials*; 2011; vol. 23; p. 1630-1634; Wiley-VCH Verlag GmbH & Co. KGaA, Weinheim.

\* cited by examiner

N-TYPE ORGANIC THIN FILM TRANSISTOR, AMBIPOLAR FIELD-EFFECT TRANSISTOR, AND METHOD OF FABRICATING THE SAME

CROSS REFERENCE TO RELATED APPLICATION

This application is a Continuation-in-Part of co-pending Application No. 12/841,678, filed on Jul. 22, 2010, and for which priority is claimed under 35 U.S.C. §120; and this application claims priority of Application No. 100146057 filed in Taiwan on Dec. 13, 2011 under 35 U.S.C. §119, the entire contents of all of which are hereby incorporated by reference.

BACKGROUND OF THE INVENTION

1. Field of the Invention

The present invention relates to an N-type organic thin film transistor, an ambipolar field-effect transistor, and methods of fabricating the same and, more particularly, to an N-type organic thin film transistor and an ambipolar field-effect transistor using silk protein as the gate-insulating layer, and methods of fabricating the same.

2. Description of Related Art

As well known to those skilled in the art, transistors are applied in a wide variety of electronics to serve as switches for electric current, e.g. valve for controlling electric current. Different from mechanical valves, transistors are controlled by electric signals and the switch-speed of the transistors can be very fast. Transistors, for examples, may be classified into bipolar junction transistors (BJTs) and field effect transistors (FETs). The field effect transistor comprises N-type organic thin film transistor (OTFT) and P-type organic thin film transistor, etc.

Usually, the electron mobility of an N-type organic thin film transistor is smaller than that of a P-type organic thin film transistor. For example, most of the N-type organic thin film transistors have an electron mobility of less than 1 $cm^2/Vs$. For a CMOS device, both N-type organic thin film transistors and P-type organic thin film transistors are used and are required to have high mobility. Since the N-type organic thin film transistors have low mobility, there is a present need to put efforts towards developing a novel N-type organic thin film transistor.

Organic Thin film transistors (whether N-type or P-type) can be classified into top contact organic thin film transistor (top contact OTFT) and bottom contact organic thin film transistor. As shown in FIG. 1A, a top contact organic thin film transistor comprises: a substrate 10; a gate electrode 11 locating on the substrate 10; a gate-insulating layer 12 disposed on the substrate 11 and covering the gate electrode 11; an organic semiconductor layer 13 covering the entire surface of the organic semiconductor layer 12; and a source electrode 14 and a drain electrode 15 disposed on the organic semiconductor layer 13.

In addition, as shown in FIG. 1B, the bottom contact OTFT comprises: a substrate 10; a gate electrode 11 disposed on the substrate 10; a gate insulating layer 12 disposed on the substrate 10 and covering the gate electrode 11; a source electrode 14 and a drain electrode 15 disposed on the gate insulating layer 12; and an organic semiconductor layer 13 entirely covering the gate insulating layer 12, the source electrode 14, and the drain electrode 15.

According to academic assays, fullerene ($C_{60}$) has high electron mobility so can be used as a semiconductive material for N-type OTFTs (N-type organic thin film transistor). In 2006, Kenji Itaka et al. used aluminum oxide as the gate-insulating layer and used pentacene in the buffering layer to improve the efficiency of the OTFTs (Kenji Itaka,* Mitsugu Yamashiro, Jun Yamaguchi, Masamitsu Haemori, Seiichiro Yaginuma, Yuji Matsumoto, Michio Kondo, and Hideomi Koinuma, "High-Mobility $C_{60}$ Field-Effect Transistors Fabricated on Molecular-Wetting Controlled Substrates" Adv. Mater. 2006, 18, 1713-1716), in which the electron mobility can be about 4.91 $cm^2/Vs$. However, the fullerene thin film is not compact enough and therefore water or oxygen may be easily diffused into fullerene thin film, which means the resultant OTFT (organic thin film transistor) is unstable in the air, has poor reliability, and has low commercial value.

In the same year (2006), Thomas D. Anthopoulosa et al. used Divinyltetramethyldisiloxane-bis(benzocyclobutene) (BCB) as an insulating-layer and used fullerene ($C_{60}$) during sputtering to increase electric properties of OTFTs (Thomas D. Anthopoulosa_Birendra Singh, Nenad Marjanovic, Niyazi S. Sariciftci, Alberto Montaigne Ramil, Helmut Sitter, Michael Cone and Dago M. de Leeuw, "High performance n-channel organic field-effect transistors and ring oscillators based on $C_{60}$ fullerene films", APPLIED PHYSICS LETTERS 89, 213504 (2006)). The as provided OTFT has an electron mobility of about 6 $cm^2/Vs$. However, the fullerene ($C_{60}$) thin film is not compact enough and is not stable in the air, and therefore the reliability of the OTFT cannot be improved and the commercial value cannot be increased.

Hagen Klauk proposed a report about N-type OTFT (at the left column on page 2605 of "Organic thin-film transistors", Chem. Soc. Rev., 39, 2643-2666 (2010)), which mentioned that there is presently no new material and/or new structure which can improve the electron mobility and stability of $C_{60}$ N-type OTFT in the air.

Therefore, it is desirable to provide an improved material and/or new structure which can make N-type OTFT in an easy way and enable the electron mobility enhancement of the N-type OTFT. A CMOS with both P-type and N-type OTFTs may exhibit excellent efficiency as a consequence.

Moreover, ambipolar field-effect transistor is a kind of transistor, which possesses both electron and hole transportations. An ambipolar field-effect transistor has a structure similar to an OTFT but the device characteristics are slightly different. The development of novel material and/or structure in the configuration of ambipolar field-effect transistors is also of great commercial value if the stability and mobility can be greatly improved.

SUMMARY OF THE INVENTION

The present invention provides an N-type organic thin film transistor (OTFT), which comprises: a substrate; a gate electrode locating on the substrate; a gate-insulating layer covering the gate electrode, and the gate-insulating layer is made of silk protein; a buffering layer locating on the gate-insulating layer, and the buffering layer is made of pentacene; an N-type organic semiconductor layer locating on the buffering layer; and a source electrode and a drain electrode, wherein the N-type organic semiconductor layer, the buffering layer, the source electrode and the drain electrode are disposed over the gate dielectric layer.

According to the present invention, the silk protein is used in the insulating layer, which has advantages such as: (1) the electron mobility can be increased; (2) a flexible transistor can be realized; and (3) a high stability can be obtained. Silk protein (e.g. fibroin which is extracted from silk) has been reported as an insulating material to increase the hole mobility of P-type pentacene OTFT (C.-H. Wang, C.-Y. Hsieh, and J.-C. Hwang, "Flexible organic thin film transistors with silk fibroin as gate dielectric" Advanced Materials 23, 1630-1634 (2011)). The present invention uses silk protein as the gate-insulating layer for N-type $C_{60}$ OTFTs, which can improve the crystalline properties of the pentacene buffer layer and improve the electron mobility of N-type OTFTs. Furthermore, the present invention is the first one using flexible silk protein in the N-type $C_{60}$ OTFT in the related field.

Silk protein is flexible and cheap so can serve as an excellent insulating layer in the flexible electronic devices. The present invention uses silk protein as the gate-insulating layer with pentacene as the buffering layer and uses other materials such as fullerene, n,n'-dioctyl-3,4,9,10-perylenedicarboximide, or similar materials that can be used in the N-type OTFT to provide N-type OTFTs. The OTFT provided by the present invention has very good electric characteristics and can be applied to a wide variety of flexible electronics such as complementary metal oxide semiconductor (CMOS) or organic light emitting transistors (OLET), and therefore the OTFT of the present invention has very high economic value.

Fullerene ($C_{60}$) is a material that is sensitive to humidity and oxygen, and therefore in the prior arts, testing processes for electronics made with $C_{60}$ are usually performed under a nitrogen atmosphere or in a vacuum condition to avoid any influence of humidity or oxygen. The N-type OTFT of the present invention has excellent air stability; the measured electron mobility is 11 $cm^2/Vs$ even though the N-type OTFT of the present invention is tested in ambient air. Therefore, it is proved that the N-type OTFT of the present invention is air-stable and has a high commercial value.

In the N-type OTFT of the present invention, the thickness of the buffering layer is preferably 1 nm to 20 nm, more preferably 1 nm to 10 nm, most preferably 3 nm.

In the N-type OTFT of the present invention, the substrate can be one selected from a group consisting of: a plastic substrate (or other flexible substrate), a glass substrate, a quartz substrate, a silicon substrate, and a paper substrate, but is not limited thereto. Preferably, the substrate is a flexible substrate, i.e. a plastic substrate or a paper substrate. When the plastic substrate or paper substrate is used, the N-type OTFT prepared in the present invention has flexibility. The material of each electrode containing the gate electrode, the source electrode, and the drain electrode may be independently selected from a group consisting of Al, Cu, Ni, Mg, Ca, Li, Cr, Ag, Pt, Au, ZnO, ITO (indium tin oxide), IZO (indium zinc oxide), AZO (aluminium zinc oxide), IGZO (indium gallium zinc oxide), etc.

In the N-type OTFT of the present invention, the gate-insulating layer preferably has a single-layered structure or a multi-layered structure. The thickness of the overall gate-insulating layer can be adjusted by the number of the individual layers added, so as to obtain higher electron mobility.

In the N-type OTFT of the present invention, the material of the N-type organic semiconductor layer may be selected from a group consisting of fullerene ($C_{60}$), PTCDI-C8 (N,N'-dioctyl-3,4,9,10-perylenedicarboximide), and the like; preferably is fullerene.

In the N-type OTFT of the present invention, the thickness of the N-type organic semiconductor layer is preferably 10 nm to 150 nm.

In the N-type OTFT of the present invention, the electron mobility is preferably 7 $cm^2/Vs$ to 15 $cm^2/Vs$.

In the N-type OTFT of the present invention, the thickness of the gate-insulating layer is preferably 100 nm to 800 nm, more preferably 300 nm to 500 nm, most preferably 400 nm.

Preferably, in the N-type OTFT of the present invention, the N-type organic semiconductor layer covers the entire surface of the buffering layer, the buffering layer covers the entire surface of the gate-insulating layer, and the source electrode and the drain electrode locate on the N-type organic semiconductor layer, when the N-type organic thin film transistor is a top contact N-type organic thin film transistor.

Preferably, in the N-type OTFT of the present invention, the source electrode and the drain electrode locate between the buffering layer and the gate-insulating layer, the buffering layer covers part of the gate-insulating layer, the source electrode and the drain electrode, when the N-type organic thin film transistor is a bottom contact N-type organic thin film transistor.

The present invention also provides a method of fabricating the above N-type OTFT, which comprises steps: (A) providing a substrate; (B) forming a gate electrode on the substrate; (C) forming a gate-insulating layer covering the gate electrode, and the gate-insulating layer is made of silk protein; and (D) forming a double-layered structure comprising a buffering layer and an N-type organic semiconductor layer; a source electrode; and a drain electrode on the gate-insulating layer; wherein the buffering layer is made of pentacene.

According to the present invention, the method for fabricating the N-type OTFT, a silk solution is used to form a gate-insulating layer or a dielectric layer on the gate electrode, which can be called a solution method. Compared with traditional methods using vacuum sputtering, vacuum evaporation, or chemical vapor deposition for forming the gate-insulating layer or dielectric layer, the present invention uses the solution method which is simple and low-cost and therefore is favorable for large-area N-type OTFT manufacturing. Simultaneously, silk protein has advantages of being easy to obtain and low cost. Also, the present invention uses silk protein as the gate-insulating layer, which can improve the crystalline properties of the pentacene thin film and improve the electric properties (e.g. electron mobility) of N-type OTFTs.

According to the present invention, the method for fabricating the N-type OTFT, the thickness of the buffering layer is preferably 1 nm to 20 nm, more preferably 1 nm to 10 nm, most preferably 3 nm.

According to the present invention, in step (D) of the method for fabricating the N-type OTFT, the N-type organic semiconductor layer is preferably formed by evaporation, and the temperature of the substrate during evaporation is preferably 25° C. to 100° C. (e.g. 70° C.). During evaporation, the temperature of the substrate will influence the resultant electron mobility of the OTFT, and therefore the temperature of the substrate should be preferably controlled between 25° C. to 100° C., more preferably 60° C. to 80° C., and most preferably 70° C.

According to the present invention, the method for fabricating the N-type OTFT, the step (C) preferably comprises the following steps: (C1) providing a silk solution; (C2) coating the substrate with the gate electrode formed thereon using the silk solution; or dipping the substrate with the gate electrode formed thereon using the silk solution; and (C3) drying the silk solution coated on the substrate with the gate electrode formed thereon to obtain a gate-insulating layer.

According to the present invention, the silk protein thin film for the gate-insulating layer or dielectric layer can be formed by a simple coating or drying step. Herein, the drying step can use those disclosed in the art such as air dry, heating, etc. If the coating step of silk solution is performed only once, a single layer of the silk protein is obtained; if the step (C) is repeated several times, a multi-layered structure is obtained.

According to the present invention, the method for fabricating the N-type OTFT, the N-type organic semiconductor layer is preferably made of material selected from a group consisted of fullerene ($C_{60}$), PTCDI-C8 (N,N'-dioctyl-3,4,9,10-perylenedicarboximide), and the like; most preferably fullerene.

According to the present invention, in step (C1) of the method for fabricating the N-type OTFT, the pH value of the silk solution is preferably 2 to 6.

According to the present invention, the method for fabricating the N-type OTFT, the thickness of the N-type organic semiconductor layer is preferably 10 nm to 150 nm, more preferably 40 nm to 80 nm, most preferably 60 nm.

According to the present invention, the method for fabricating the N-type OTFT, the electron mobility of the N-type organic thin film transistor is preferably 7 $cm^2$/Vs to 15 $cm^2$/Vs (e.g. 11 $cm^2$/Vs) when the N-type organic semiconductor layer is made of fullerene ($C_{60}$).

According to the present invention, the method for fabricating the N-type OTFT, the thickness of the gate-insulating layer is preferably 100 nm to 800 nm, more preferably 300 nm to 500 nm, most preferably 400 nm.

According to the present invention, in the step (D) of the method for fabricating the N-type OTFT, the N-type organic semiconductor layer preferably covers the entire surface of the buffering layer, the buffering layer preferably covers the entire surface of the gate-insulating layer, and the source electrode and the drain electrode locate on the N-type organic semiconductor layer so as to give a top contact N-type organic thin film transistor.

According to the present invention, in the step (D) of the method for fabricating the N-type OTFT, the source electrode and the drain electrode preferably locate between the buffering layer and the gate-insulating layer, the buffering layer preferably covers part of the gate-insulating layer, the source electrode and the drain electrode so as to give a bottom contact N-type organic thin film transistor.

The present invention further provides an ambipolar field-effect transistor, comprising: a substrate; a gate electrode locating on the substrate; a gate-insulating layer covering the gate electrode, and the gate-insulating layer is made of silk protein; a P-type organic semiconductor layer locating on the gate-insulating layer, and the P-type organic semiconductor layer is made of pentacene; an N-type organic semiconductor layer locating on the P-type organic semiconductor layer; and a source electrode and a drain electrode, wherein the P-type organic semiconductor layer, N-type organic semiconductor layer, the source electrode and the drain electrode are disposed over the gate dielectric layer.

According to the present invention, the silk protein is used in the insulating layer, which has advantages such as: (1) the electron mobility can be increased; (2) a flexible transistor can be realized; and (3) a high air stability can be obtained. The present invention uses silk protein as the gate-insulating layer, which can improve the crystalline properties of the pentacene thin film and improve the electron mobility of ambipolar field-effect transistor, and can be applied to flexible electronics. Furthermore, the present invention is the first one using flexible silk protein in the ambipolar field-effect transistor in the related field.

Fullerene ($C_{60}$) is a material that is sensitive to humidity and oxygen, and therefore in the prior arts, testing process for electronics made with $C_{60}$ are usually performed under a nitrogen atmosphere or in a vacuum condition to avoid the influence of humidity or oxygen. The ambipolar field-effect transistor of the present invention has excellent stability; the measured electron mobility is 4 $cm^2$/Vs to 13 $cm^2$/Vs (e.g. 7 $cm^2$/Vs) even though the ambipolar field-effect transistor of the present invention is tested in ambient air (without nitrogen atmosphere nor in a vacuum condition). Therefore, it is proved that the ambipolar field-effect transistor of the present invention is air-stable and has a high commercial value.

According to the present invention, in the ambipolar field-effect transistor, the material of the N-type organic semiconductor layer may be selected from a group consisting of fullerene ($C_{60}$), PTCDI-C8 (N,N'-dioctyl-3,4,9,10-perylene-dicarboximide), and the like; preferably is fullerene.

According to the present invention, in the ambipolar field-effect transistor, the substrate can be one selected from a group consisted of: a plastic substrate (or other flexible substrate), a glass substrate, a quartz substrate, a silicon substrate, and a paper substrate, but is not limited thereto. Preferably, the substrate is a flexible substrate, i.e. a plastic substrate or a paper substrate. When the plastic substrate or paper substrate is used, the ambipolar field-effect transistor prepared in the present invention has flexibility. The material of each electrode containing the gate electrode, the source electrode, and the drain electrode may be independently selected from a group consisting of Al, Cu, Ni, Mg, Ca, Li, Cr, Ag, Pt, Au, ZnO, ITO (indium tin oxide), IZO (indium zinc oxide), AZO (aluminium zinc oxide), IGZO (indium gallium zinc oxide), etc.

According to the present invention, in the ambipolar field-effect transistor, the gate-insulating layer preferably has a single-layered structure or a multi-layered structure. The thickness of the overall gate-insulating layer can be adjusted with the number of the individual layers added, so as to obtain higher electron mobility.

According to the present invention, in the ambipolar field-effect transistor, the thickness of the P-type organic semiconductor layer is preferably 3 nm to 60 nm, more preferably 10 nm to 30 nm, most preferably 10 nm; and the thickness of the N-type organic semiconductor layer is preferably 10 nm to 100 nm, more preferably 20 nm to 60 nm, most preferably 40 nm.

According to the present invention, for the ambipolar field-effect transistor, the electron and/or hole mobility of the ambipolar field-effect transistor is preferably 4 $cm^2$/Vs to 13 $cm^2$/Vs (e.g. 7 $cm^2$/Vs) when the N-type organic semiconductor layer is made of fullerene ($C_{60}$) and the P-type organic semiconductor layer is made of pentacene.

According to the present invention, for the ambipolar field-effect transistor, the thickness of the gate-insulating layer is preferably 100 nm to 800 nm, more preferably 300 nm to 500 nm, most preferably 400 nm.

According to the present invention, for the ambipolar field-effect transistor, the N-type organic semiconductor layer preferably covers the entire surface of the P-type organic semiconductor layer, the P-type organic semiconductor layer preferably covers the entire surface of the gate-insulating layer, and the source electrode and the drain electrode locate on the N-type organic semiconductor layer, when the ambipolar field-effect transistor is a top contact ambipolar field-effect transistor.

According to the present invention, for the ambipolar field-effect transistor, the source electrode and the drain electrode preferably locate between the P-type organic semiconductor layer and the gate-insulating layer, the P-type organic semiconductor layer preferably covers part of the gate-insulating layer, the source electrode and the drain electrode, when the ambipolar field-effect transistor is a bottom contact ambipolar field-effect transistor.

According to the present invention, for the ambipolar field-effect transistor, the source electrode and the drain electrode preferably locate between the N-type organic semiconductor layer and the P-type organic semiconductor layer, the P-type organic semiconductor layer preferably covers the entire surface of the gate-insulating layer, when the ambipolar field-effect transistor is a middle contact ambipolar field-effect transistor.

The present invention further provides a method of fabricating an ambipolar field-effect transistor, which comprises the following step: (A) providing a substrate; (B) forming a gate electrode on the substrate; (C) forming a gate-insulating layer covering the gate electrode, and the gate-insulating layer is made of silk protein; and (D) forming a multi-layered structure comprising a P-type organic semiconductor layer, an N-type organic semiconductor layer; a source electrode; and a drain electrode on the gate-insulating layer; wherein the P-type organic semiconductor layer is made of pentacene.

According to the present invention, the method of fabricating the ambipolar field-effect transistor, a silk solution is used to form a gate-insulating layer or a dielectric layer on the gate electrode, which can be called a solution method. Compared with traditional methods using vacuum sputtering, vacuum evaporation, or chemical vapor deposition for forming the gate-insulating layer or dielectric layer, the present invention uses the solution method which is simple and low-cost and therefore is favorable for large-area ambipolar field-effect transistor manufacturing. Simultaneously, silk protein has advantages of being easy to obtain and low cost. Also, the present invention uses silk protein as the gate-insulating layer, which can improve the crystalline properties of the pentacene thin film and improve the electric properties (e.g. electron mobility) of ambipolar field-effect transistors.

According to the present invention, the method of fabricating the ambipolar field-effect transistor, the thickness of the P-type organic semiconductor layer is preferably 3 nm to 60 nm, more preferably 10 nm to 30 nm, most preferably 10 nm.

According to the present invention, the method of fabricating the ambipolar field-effect transistor, the N-type organic semiconductor layer is preferably made of material selected from a group consisted of fullerene ($C_{60}$), PTCDI-C8 (N,N'-dioctyl-3,4,9,10-perylenedicarboximide), and the like; most preferably fullerene.

According to the present invention, in step (D) of the method of fabricating the ambipolar field-effect transistor, the N-type or P-type organic semiconductor layer is preferably formed by evaporation, and the temperature of the substrate during evaporation is 25° C. to 100° C. (e.g. 70° C.). During evaporation, the temperature of the substrate will influence the resultant electron mobility of the OTFT, and therefore the temperature of the substrate should be preferably controlled between 25° C. to 100° C., more preferably 60° C. to 80° C., and most preferably 70° C.

According to the present invention, the method of fabricating the ambipolar field-effect transistor, the substrate can be one selected from a group consisted of: a plastic substrate (or other flexible substrate), a glass substrate, a quartz substrate, a silicon substrate, and a paper substrate, but is not limited thereto. Preferably, the substrate is a flexible substrate, i.e. a plastic substrate or a paper substrate. When the plastic substrate or paper substrate is used, the ambipolar field-effect transistor prepared in the present invention has flexibility. The material of each electrode containing the gate electrode, the source electrode, and the drain electrode may be independently selected from a group consisting of Al, Cu, Ni, Mg, Ca, Li, Cr, Ag, Pt, Au, ZnO, ITO (indium tin oxide), IZO (indium zinc oxide), AZO (aluminium zinc oxide), IGZO (indium gallium zinc oxide), etc.

According to the present invention, in step (C) of the method of fabricating the ambipolar field-effect transistor, the step (C) preferably comprises the following steps: (C1) providing a silk solution; (C2) coating the substrate with the gate electrode formed thereon using the silk solution; or dipping the substrate with the gate electrode formed thereon using the silk solution; and (C3) drying the silk solution coated on the substrate with the gate electrode formed thereon to obtain a gate-insulating layer.

According to the present invention, the method of fabricating the ambipolar field-effect transistor, the gate-insulating layer preferably has a single-layered structure or a multi-layered structure. The thickness of the overall gate-insulating layer can be adjusted with the number of the individual layers added, so as to obtain proper/higher electron and/or hole mobility.

According to the present invention, in step (C1) of the method of fabricating the ambipolar field-effect transistor, the pH value of the silk solution is preferably 2 to 6.

According to the present invention, the method of fabricating the ambipolar field-effect transistor, the thickness of the P-type organic semiconductor layer is preferably 3 nm to 60 nm, more preferably 10 nm to 30 nm, most preferably 10 nm; and the thickness of the N-type organic semiconductor layer is preferably 10 nm to 100 nm, more preferably 20 nm to 60 nm, most preferably 40 nm.

According to the present invention, the method of fabricating the ambipolar field-effect transistor, the electron mobility of the ambipolar field-effect transistor is preferably 4 cm$^2$/Vs to 13 cm$^2$/Vs (e.g. 7 cm$^2$/Vs) when the N-type organic semiconductor layer is made of fullerene ($C_{60}$) and the P-type organic semiconductor layer is made of pentacene.

According to the present invention, the method of fabricating the ambipolar field-effect transistor, the thickness of the gate-insulating layer is preferably 100 nm to 800 nm, more preferably 300 nm to 500 nm; and most preferably 400 nm.

According to the present invention, in step (D) of the method of fabricating the ambipolar field-effect transistor, the N-type organic semiconductor layer preferably covers the P-type organic semiconductor layer, the P-type organic semiconductor layer preferably covers the entire surface of the gate-insulating layer, and the source electrode and the drain electrode locate on the N-type organic semiconductor layer, so as to form a top contact ambipolar field-effect transistor.

According to the present invention, in step (D) of the method of fabricating the ambipolar field-effect transistor, the source electrode and the drain electrode preferably locate between the P-type organic semiconductor layer and the gate-insulating layer, the P-type organic semiconductor layer preferably covers part of the gate-insulating layer, the source electrode and the drain electrode, so as to form a bottom contact ambipolar field-effect transistor.

Other objects, advantages, and novel features of the invention will become more apparent from the following detailed description when taken in conjunction with the accompanying drawings.

DETAILED DESCRIPTION OF THE PREFERRED EXAMPLE

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Example 1

Top Contact N-Type OTFT

[Preparation of a Silk Solution]

First, 10 wt % of an aqueous solution of $Na_2CO_3$ was provided and heated. When the solution was boiling, natural silk was added thereto, and the solution was kept boiling to remove sericin. Then, the silk without sericin was washed by deionized water to remove the alkali salt adhered on the silk. After a drying process, refined silk, i.e. fibroin, was obtained.

Next, the refined silk was added into 85 wt % of phosphoric acid ($H_3PO_4$) solution (20 ml), and the resulted solution was stirred until the refined silk was dissolved. Then, the phosphoric acid solution containing the refined silk was put into a membrane (Spectra/Por 3 membrane, molecular weight cut-off=14000). A dialysis process was performed for 3 days to remove the phosphoric acid. Besides removing the phosphoric acid, the final pH value of the fibroin solution may also be controlled by adjusting the volume and the number of times the filtering is performed. Herein, the pH value of the fibroin solution is controlled in between 2 to 6. Finally, a filter paper is used to filter out impurities, and an aqueous solution of fibroin was obtained.

[Preparation of a Top Contact N-Type OTFT]

Figure 1A:
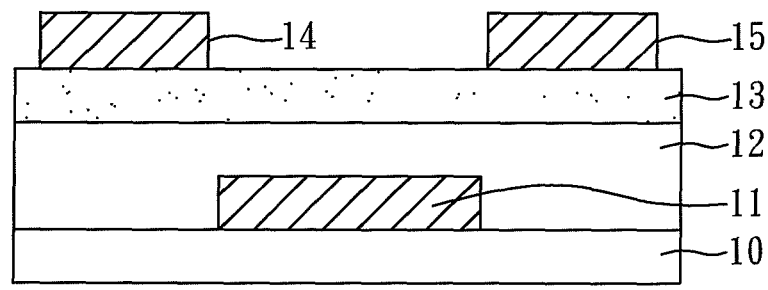
FIG. 1A is a perspective view of a conventional top contact OTFT.
Figure 1B:
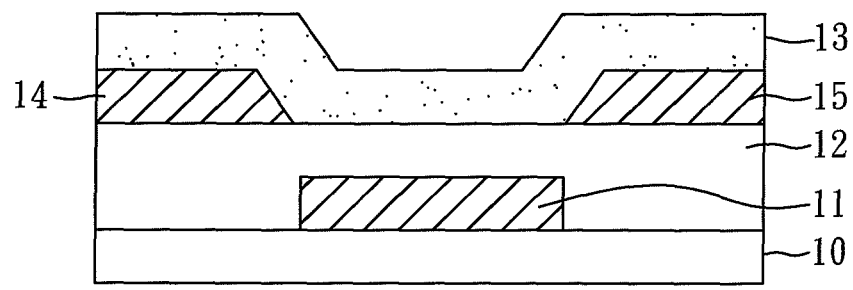
FIG. 1B is a perspective view of a conventional bottom contact OTFT.
Figure 2A:
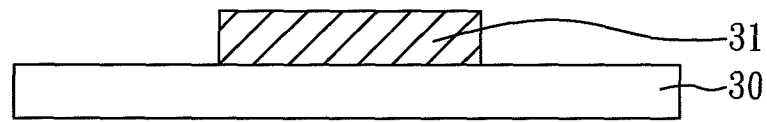
FIGS. 2A to 2E are cross-sectional views illustrating the process for manufacturing a top contact N-type OTFT in Example 1 of the present invention.

As shown in FIG. 2A, a substrate 30 was provided, and the substrate 30 was cleaned by deionized water through a sonication process. In the present example, the substrate 30 was a plastic substrate made of PET, but is not limited thereto, the substrate may also be made of glass, quartz, silicon, paper, etc.

Next, the substrate 30 was placed inside a vacuum chamber (not shown in the figure), and a metal was evaporated on the substrate 30 by using a mask (not shown in the figure) to form a patterned metal layer, which was used as a gate electrode 31, as shown in FIG. 2A. In the present example, the metal used in the gate electrode 31 was gold (Au), and the thickness of the gate electrode 31 was about 80 nm. In addition, the condition of the evaporation process for forming the gate electrode 31 is listed below.

Pressure: $5 \times 10^{-6}$ torr

Evaporation rate: 1 Å/s

Figure 2B:
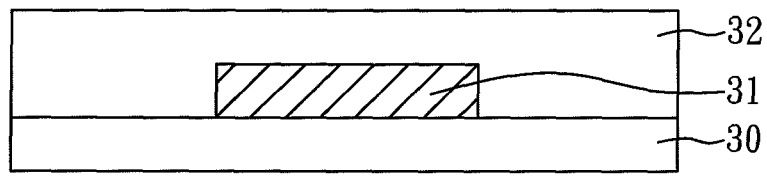

Then, the substrate 30 having the gate electrode 31 formed thereon was dipped into the silk solution for 15 minutes to coat the substrate 30 having the gate electrode 31 with the silk solution. After the coating process, the substrate 30 coated with the silk solution was dried at 60° C. to form a silk film, and the silk film was used as a gate insulating layer 32, as shown in FIG. 2B. In the present example, the gate insulating layer 32 formed by the silk film has a thickness of 400 nm. In addition, the coating process and the drying process can be performed several times to form a silk film with multi-layered structure.

Figure 2C:
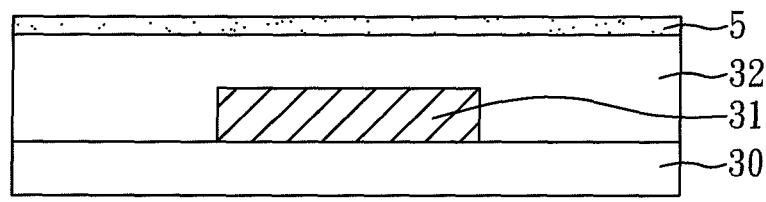

As shown in FIG. 2C, through a heat evaporation process, pentacene was deposited on the gate insulating layer 32 at room temperature (about 25° C.) by use of a shadow metal mask (not shown) to form a buffering layer 5. In the present example, the thickness of the buffering layer 5 is about 3 nm. In addition, the conditions of the heat evaporation process for forming the buffering layer 5 are listed below.

Pressure: $2 \times 10^{-6}$ torr

Evaporation rate: 0.3 Å/s

Figure 2D:
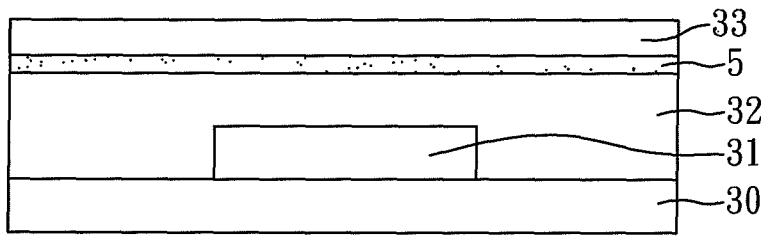

Then, an another shadow metal mask (not shown) was used to form a fullerene ($C_{60}$) thin film having a thickness of about 60 nm, through an evaporation process at a temperature of 70° C., to serve as an N-type organic semiconductor layer 33, as shown in FIG. 2D. In addition, the conditions of the evaporation process for forming the N-type organic semiconductor layer 33 are listed below.

Pressure: $2 \times 10^{-6}$ torr

Evaporation rate: 0.3 Å/s

Figure 2E:
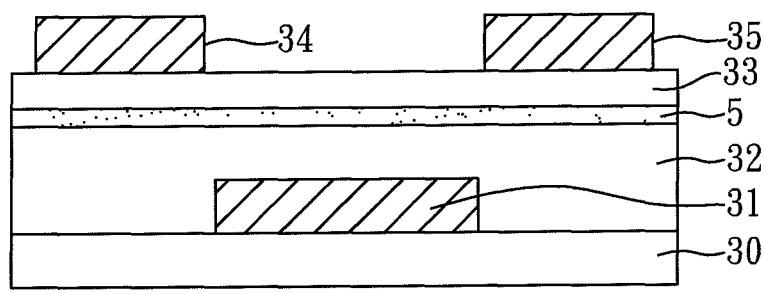

Finally, the same evaporation process for forming the gate electrode was performed to form a patterned metal layer, which was used as a source electrode 34 and a drain electrode 35, on the N-type organic semiconductor layer 33 by using still another mask, as shown in the FIG. 2E. In the present example, the material of the source electrode 34 and the drain electrode 35 was Au, and the thickness of source electrode 34 and the drain electrode 35 was about 70 nm.

As shown in FIG. 2E, after the aforementioned process, a top contact N-type OTFT of the present example was obtained, which comprises: a substrate 30; a gate electrode 31 disposed on the substrate 30; a gate insulating layer 32 disposed on the substrate 30 and covering the gate electrode 31, wherein the gate insulating layer 32 comprises silk fibroin; a buffering layer 5 covering the entire surface of the gate insulating layer 32; an N-type organic semiconductor layer 33 covering the entire surface of the buffering layer 5; and a source electrode 34 and a drain electrode 35, disposed on the organic semiconductor layer 33.

Evaluation the Characteristics of the N-Type OTFT

Figure 3:
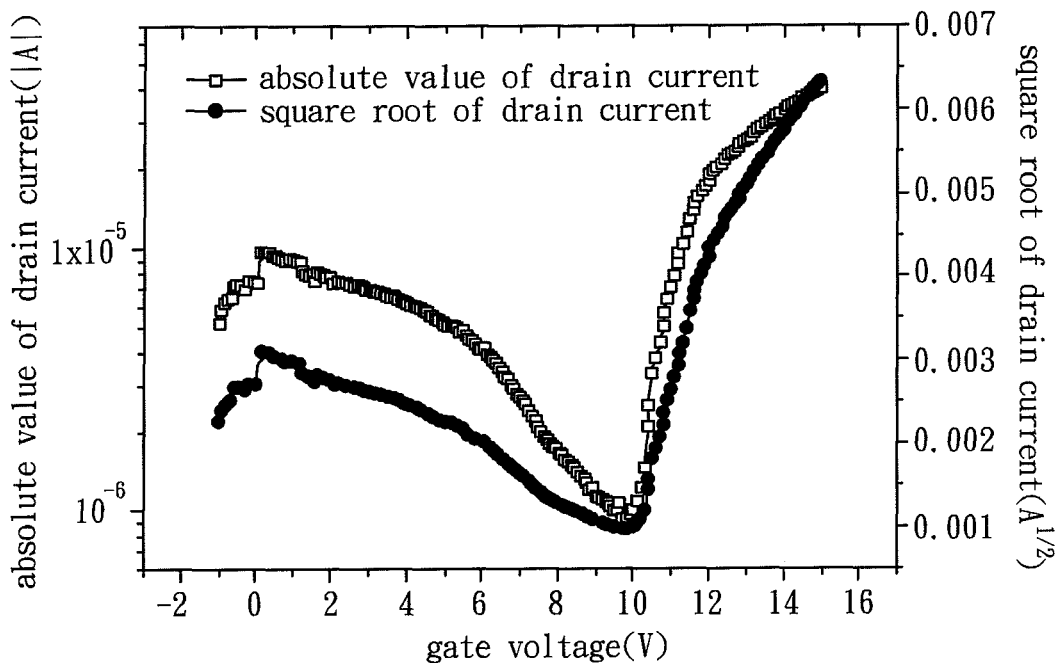
FIG. 3 is a curve showing the transfer characteristic of the N-type OTFT of Example 1 of the present invention.
Figure 4:
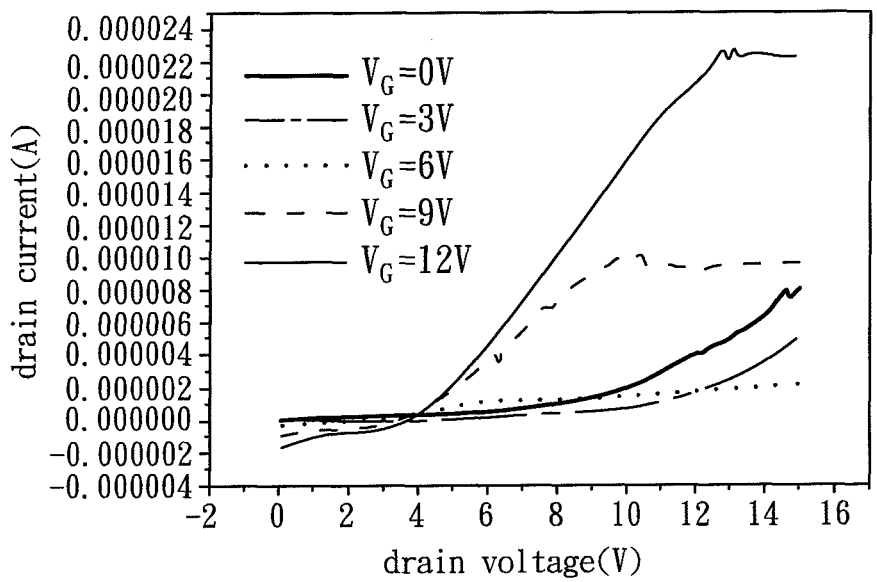
FIG. 4 is a curve showing the output characteristic of the N-type OTFT of Example 1 of the present invention.

A current-voltage test was performed on the top contact N-type OTFT of the present example. The result of the transfer characteristic of the N-type OTFT is shown in FIG. 3, and the result of the output characteristic under different gate voltage ($V_G$) is shown in FIG. 4. The electron mobility is about 11 cm$^2$/Vs as listed in the following Table 1.

According to the results shown in FIG. 3, it is shown that the N-type OTFT of the present example indeed has electron transportation characteristics.

The top contact N-type OTFT of the present example has many advantages such as thin thickness of the pentacene film, high stability in air, being flexible, low manufacturing temperature, high electron mobility, environmentally friendly, and low cost (the silk material is cheap), and therefore the N-type OTFT of the present example is suitable to be used in devices such as CMOS (complementary metal oxide semiconductor) or OLET (organic light emitting transistor) and has a high commercial value.

Fullerene ($C_{60}$) is a material that is sensitive to humidity and oxygen, and therefore in the prior arts, testing processes for electronics made with $C_{60}$ are usually performed under a nitrogen atmosphere or in a vacuum condition to avoid the influence of humidity or oxygen. The N-type OTFT of the present invention has excellent air stability; the measured electron mobility is 11 cm$^2$/Vs even though the N-type OTFT of the present invention is tested in ambient air. Therefore, it is proved that the N-type OTFT of the present invention is air-stable and has a high commercial value.

Example 2

Bottom-Contact N-Type OTFT

Figure 5A:
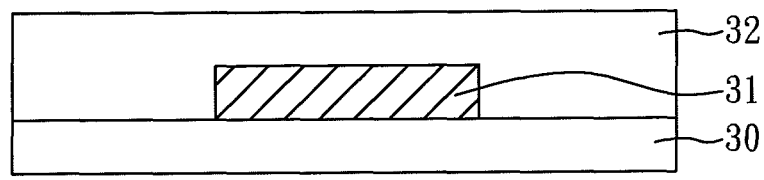
FIGS. 5A to 5D are cross-sectional views illustrating the process for manufacturing a bottom contact OTFT in Example 2 of the present invention.

As shown in FIG. 5A, a substrate 30 was provided, and a gate electrode 31 and a gate insulating layer 32 was formed on the substrate 30 sequentially. In the present example, the preparing methods and the materials of the substrate 30, the gate electrode 31, and the gate-insulating layer 32 are the same as those illustrated in example 1. In addition, in the present example, the thickness of the gate electrode 31 was about 80 nm, and the thickness of the gate-insulating layer 32 was about 400 nm.

Figure 5B:
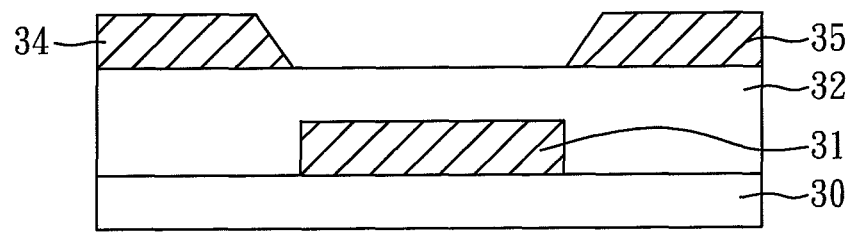
Figure 5C:
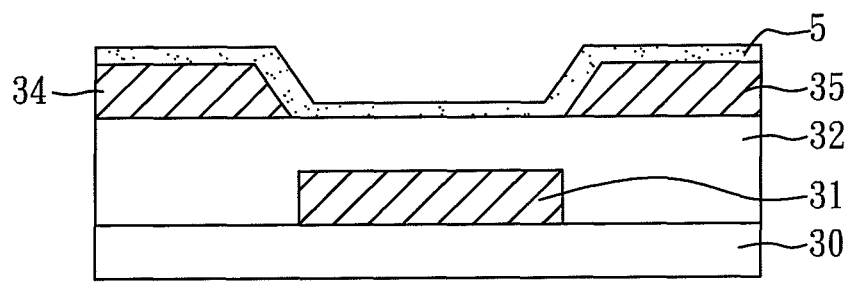

Next, the evaporation process was performed on the gate insulating layer 32 to form a patterned metal layer through the same evaporation process for forming the gate electrode described in Example 1, wherein the patterned metal layer was used as a source electrode 34 and a drain electrode 35, as shown in FIG. 5B. In the present example, the material of the source electrode 34 and the drain electrode 35 was Au, and the thickness of the source electrode 34 and the drain electrode 35 was about 70 nm.

Then, a buffering layer 5 was formed on the gate insulating layer 32, the source electrode 34 and the drain electrode 35 using the same method for forming the buffering layer described in Example 1, wherein the material of the buffering layer 5 was pentacene, and the thickness of the buffering layer 5 was about 3 nm.

Figure 5D:
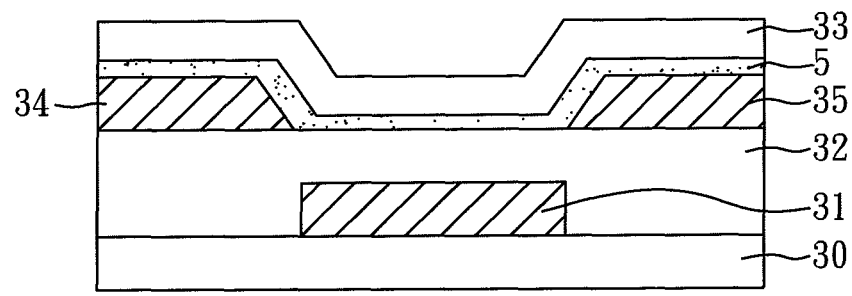

Finally, an N-type organic semiconductor layer 33 was formed on the buffering layer 5 through the same process for forming the N-type organic semiconductor layer described in Example 1, as shown in FIG. 5D. In the present example, the material of the N-type organic semiconductor layer 33 is fullerene, and the thickness of the N-type organic semiconductor layer 33 is about 60 nm.

As shown in FIG. 5D, after the aforementioned process, a bottom contact N-type OTFT of the present example was obtained, which comprises: a substrate 30; a gate electrode 31 disposed on the substrate 30; a gate insulating layer 32 disposed on the substrate 30 and covering the gate electrode 31, wherein the gate insulating layer 32 comprises silk fibroin; a source electrode 34 and a drain electrode 35 located on the gate insulating layer 32; a buffering layer 5 covering part of the gate-insulating layer 32, the source electrode 34 and the drain electrode 35; and an N-type organic semiconductor layer 33 covering the entire surface of the buffering layer 5.

Example 3

Top Contact Ambipolar Field-Effect Transistor

Figure 6A:
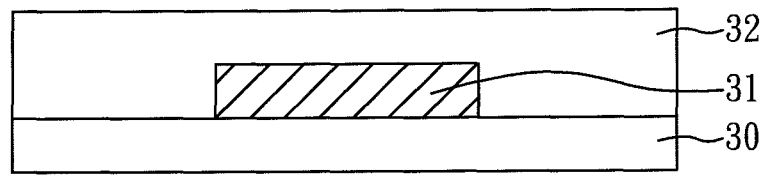
FIGS. 6A to 6D are cross-sectional views illustrating the process for manufacturing a top contact ambipolar field-effect transistor in Example 3 of the present invention.

As shown in FIG. 6A, a substrate 30 was provided, and a gate electrode 31 and a gate insulating layer 32 was formed on the substrate 30 sequentially. In the present example, the preparing methods and the materials of the substrate 30, the gate electrode 31, and the gate-insulating layer 32 are the same as those illustrated in example 1. In addition, in the present example, the thickness of the gate electrode 31 was about 80 nm, and the thickness of the gate-insulating layer 32 was about 400 nm.

Figure 6B:
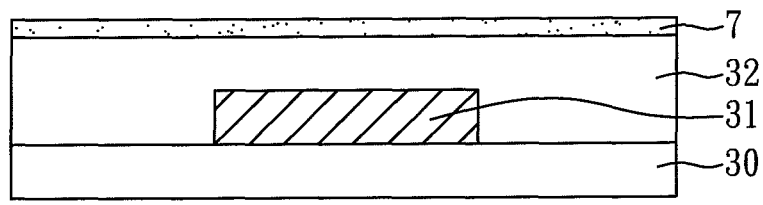

Then, as shown in FIG. 6B, a P-type organic semiconductor layer 7 was formed on the gate insulating layer 32 using the same method for forming the buffering layer described in Example 1, wherein the material of the P-type organic semiconductor layer 7 was pentacene, and the thickness of the P-type organic semiconductor layer 7 was about 10 nm.

Figure 6C:
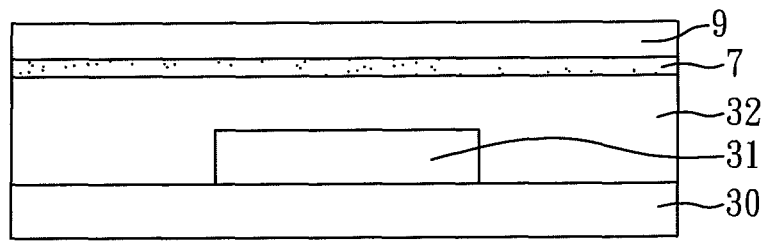

Next, as shown in FIG. 6C, an N-type organic semiconductor layer 9 was formed on the P-type organic semiconductor layer 7 using the same method for forming the N-type organic semiconductor layer described in Example 1, wherein the material of the N-type organic semiconductor layer 9 was fullerene, and the thickness of the N-type organic semiconductor layer 9 was about 40 nm.

Figure 6D:
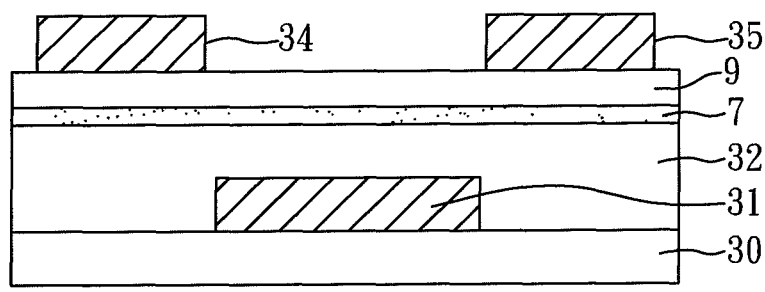

Finally, as shown in FIG. 6D, the evaporation process was performed on the N-type organic semiconductor layer 9 to form a patterned metal layer through the same evaporation process for forming the gate electrode described in Example 1, wherein the patterned metal layer was used as a source electrode 34 and a drain electrode 35. In the present example, the material of the source electrode 34 and the drain electrode 35 was Au, and the thickness of the source electrode 34 and the drain electrode 35 was about 70 nm.

As shown in FIG. 6D, after the aforementioned process, a top contact ambipolar field-effect transistor of the present example was obtained, which comprises: a substrate 30; a gate electrode 31 disposed on the substrate 30; a gate insulating layer 32 disposed on the substrate 30 and covering the gate electrode 31, wherein the gate insulating layer 32 comprises silk fibroin; a P-type organic semiconductor layer 7 covering the entire surface of the gate insulating layer 32; an N-type organic semiconductor layer 9 covering the entire surface of the P-type organic semiconductor layer 7; and a source electrode 34 and a drain electrode 35 located on the N-type organic semiconductor layer 9.

Evaluation of the Characteristics of the Ambipolar Field-Effect Transistor

Figure 7A:
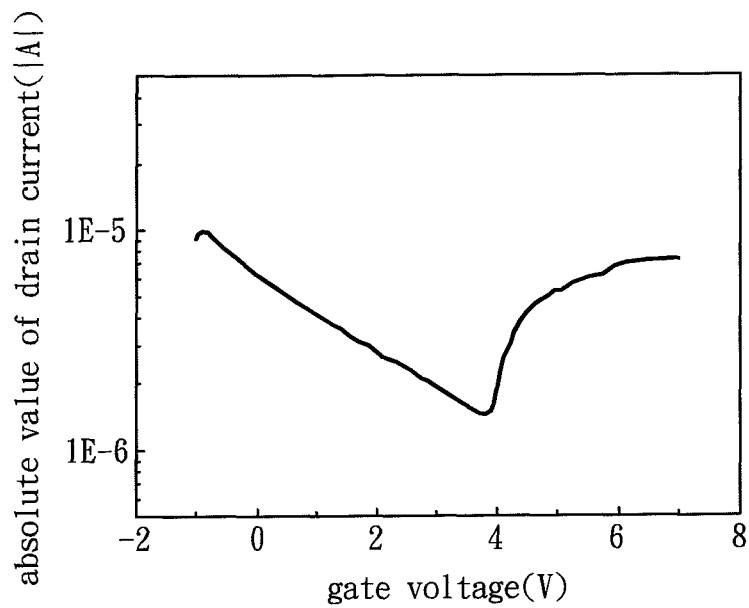
FIG. 7A is a curve showing the transfer characteristic of the ambipolar field-effect transistor of Example 3 of the present invention at the gate positive bias.
Figure 7B:
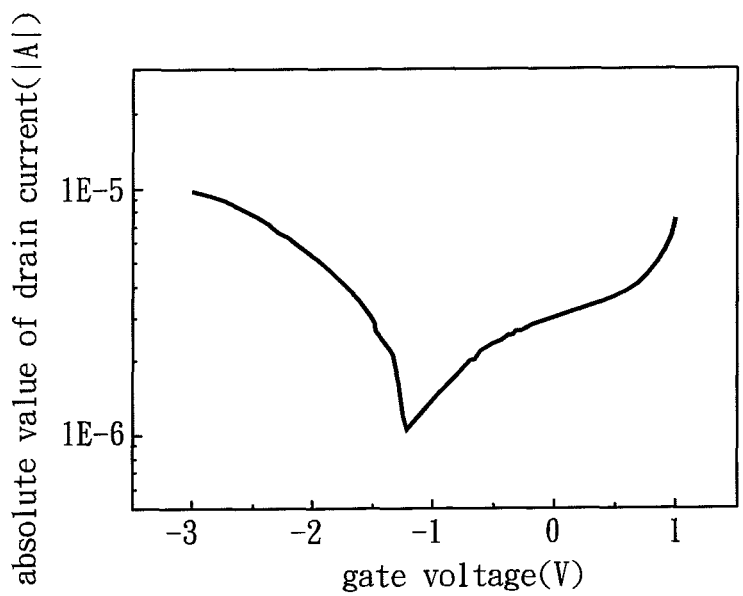
FIG. 7B is a curve showing the transfer characteristic of the ambipolar field-effect transistor of Example 3 of the present invention at the gate negative bias.
Figure 8A:
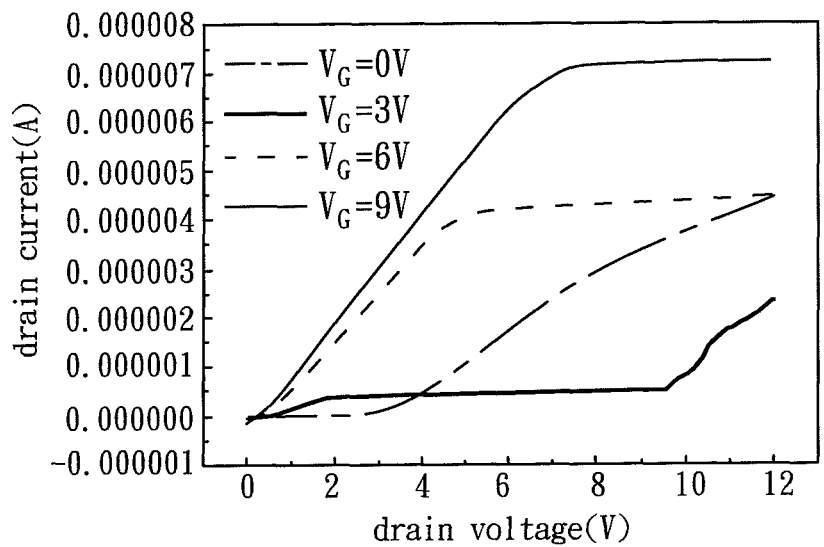
FIG. 8A is a curve showing the output characteristic of the ambipolar field-effect transistor of Example 3 of the present invention at the gate positive bias.
Figure 8B:
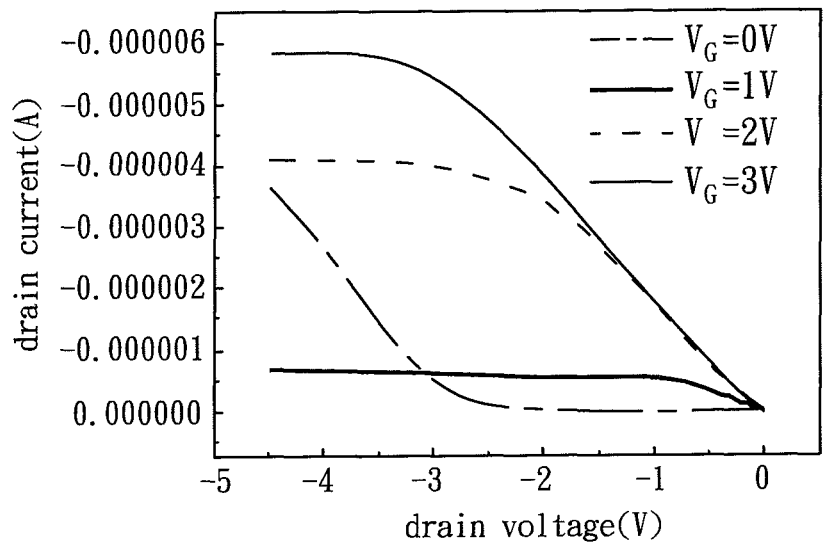
FIG. 8B is a curve showing the output characteristic of the ambipolar field-effect transistor of Example 3 of the present invention at the gate negative bias.

A current-voltage test was performed on the ambipolar field-effect transistor of the present example. The result of the transfer characteristics of the ambipolar field-effect transistor is shown in FIGS. 7A and 7B, and the result of the output characteristics under different gate voltage ($V_G$) is shown in FIGS. 8A and 8B. The electron mobility is about 6.9 cm²/Vs, and the hole mobility is about 6.5 cm²/Vs as shown in the following Table 2.

From the result of the FIGS. 7A and 7B, it is shown that the ambipolar field-effect transistor of the present example has excellent electron mobility and hole mobility, which means the ambipolar field-effect transistor of the present example has good electrical characteristics. In addition, since the ambipolar field-effect transistor of the present example is flexible, having high stability and low processing cost (due to the low price of the silk material), it has a high commercial value.

The ambipolar field-effect transistor of the present example has many advantages such as thin thickness of the fullerene film and the pentacene film, high stability in air, being flexible, low manufacturing temperature, high electron and/or hole mobility, environmentally friendly, and low cost (the silk material is cheap), and therefore has a high commercial value.

Fullerene ($C_{60}$) is a material that is sensitive to humidity and oxygen, and therefore in the prior arts, testing processes for electronics made with $C_{60}$ are usually performed under a nitrogen atmosphere or in a vacuum condition to avoid the influence of humidity or oxygen. The ambipolar field-effect transistor of the present invention has excellent stability; the measured electron and/or hole mobility is 4 to 13 cm²/Vs even though the ambipolar field-effect transistor of the present invention is tested in ambient air (without nitrogen atmosphere nor in a vacuum condition). Therefore, it is proved that the ambipolar field-effect transistor of the present invention is air-stable and has a high commercial value.

Example 4

Bottom Contact Ambipolar Field-Effect Transistor

Figure 9A:
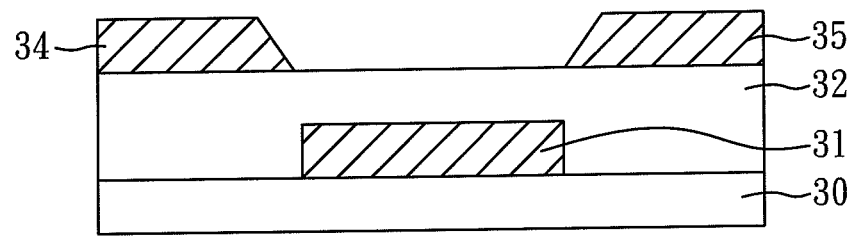
FIGS. 9A to 9C are cross-sectional views illustrating the process for manufacturing a bottom contact ambipolar field-effect transistor in Example 4 of the present invention.

As shown in FIG. 9A, a substrate 30 was provided, and a gate electrode 31, a gate insulating layer 32, and a source electrode 34 and a drain electrode 35 were sequentially formed on the substrate 30. In the present example, the materials and the forming methods of the substrate 30, the gate electrode 31, the gate insulating layer 32, and the source electrode 34 and the drain electrode 35 were the same as those in example 2. Herein, the thickness of the gate electrode 31 was about 80 nm, and thickness of the gate insulating layer 32 was about 400 nm.

Figure 9B:
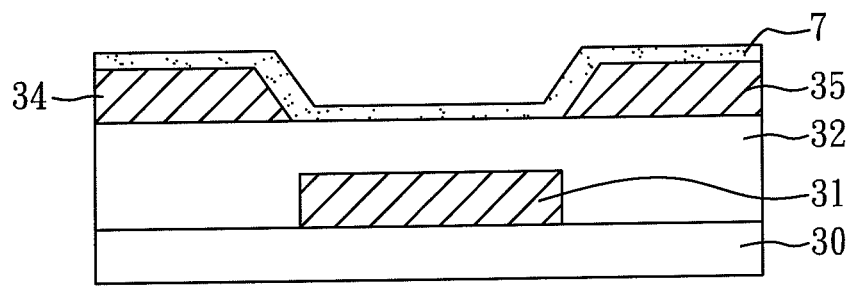

Then, as shown in FIG. 9B, a P-type organic semiconductor layer 7 was formed on the gate insulating layer 32, and the source electrode 34 and the drain electrode 35 using the same method for forming the buffering layer described in Example 1, wherein the material of the P-type organic semiconductor layer 7 was pentacene, and the thickness of the P-type organic semiconductor layer 7 was about 10 nm.

Figure 9C:
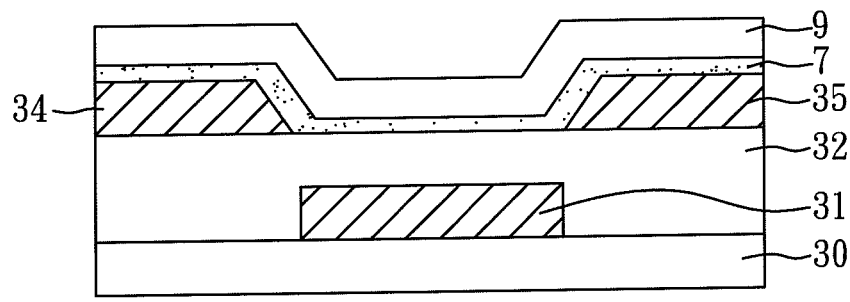

Finally, as shown in FIG. 9C, an N-type organic semiconductor layer 9 was formed on the P-type organic semiconductor layer 7 using the same method for forming the N-type organic semiconductor layer described in Example 1, wherein the material of the N-type organic semiconductor layer 9 was fullerene, and the thickness of the N-type organic semiconductor layer 9 was about 40 nm.

As shown in FIG. 9C, after the aforementioned process, a bottom contact ambipolar field-effect transistor of the present example was obtained, which comprises: a substrate 30; a gate electrode 31 disposed on the substrate 30; a gate insulating layer 32 disposed on the substrate 30 and covering the gate electrode 31, wherein the gate insulating layer 32 comprises silk fibroin; a source electrode 34 and a drain electrode 35 located on the gate insulating layer 32; a P-type organic semiconductor layer 7 covering part of the gate-insulating layer 32, the source electrode 34 and the drain electrode 35; and an N-type organic semiconductor layer 33 covering the entire surface of the P-type organic semiconductor layer 7.

Example 5

Middle Contact Ambipolar Field-Effect Transistor

Figure 10A:
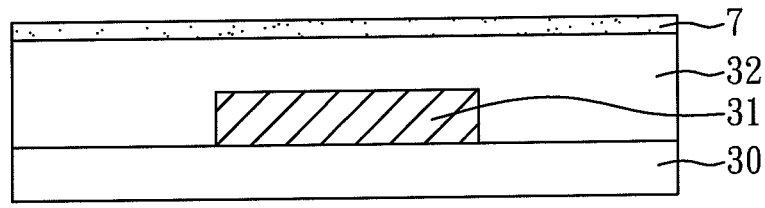
FIGS. 10A to 10C are cross-sectional views illustrating the process for manufacturing a middle contact ambipolar field-effect transistor in Example 5 of the present invention.

As shown in FIG. 10A, a substrate 30 was provided, and a gate electrode 31, a gate insulating layer 32, and a P-type organic semiconductor layer 7 were sequentially formed on the substrate 30. In the present example, the materials and the forming methods of the substrate 30, the gate electrode 31, the gate insulating layer 32, and the P-type organic semiconductor layer 7 were the same as those in example 3. Herein, the thickness of the gate electrode 31 was about 80 nm, and thickness of the gate insulating layer 32 was about 400 nm.

Figure 10B:
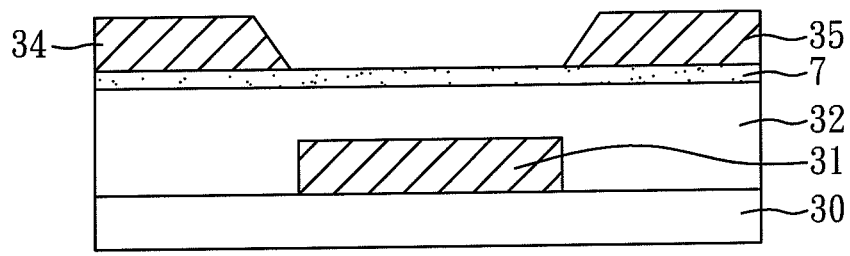

Next, as shown in FIG. 10B, a source electrode 34 and a drain electrode 35 were formed on the P-type organic semiconductor layer 7 by using the same methods and same materials as illustrated in Example 3.

Finally, an N-type organic semiconductor layer 9 was formed on the source electrode 34 and the drain electrode 35 through the same process for forming the N-type organic semiconductor layer described in Example 1. In the present example, the material of the N-type organic semiconductor layer 9 is fullerene, and the thickness of the N-type organic semiconductor layer 9 is about 100 nm.

Figure 10C:
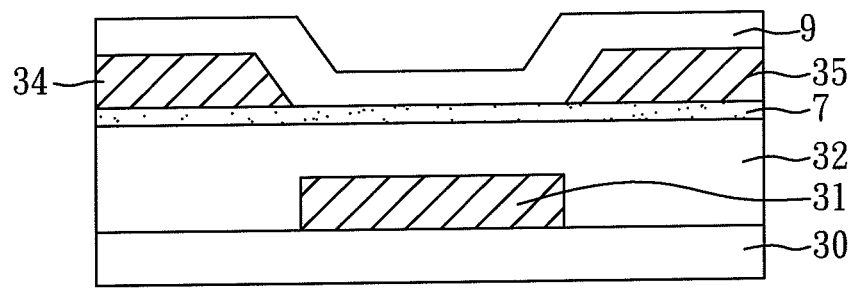

As shown in FIG. 10C, after the aforementioned process, a middle contact ambipolar field-effect transistor of the present example was obtained, which comprises: a substrate 30; a gate electrode 31 disposed on the substrate 30; a gate insulating layer 32 disposed on the substrate 30 and covering the gate electrode 31, wherein the gate insulating layer 32 comprises silk fibroin; a P-type organic semiconductor layer 7 disposed on the gate insulating layer 32; a source electrode 34 and a drain electrode 35 located on the P-type organic semiconductor layer 7; and an N-type organic semiconductor layer 9 covering the entire surface of the source electrode 34 and the drain electrode 35.

Example 6

Top Contact N-Type OTFT

Except that the fullerene material is replaced with PTCDI-C8 (N,N'-dioctyl-3,4,9,10-perylenedicarboximide) to provide the N-type organic semiconductor layer 33, the other fabricating conditions and materials were the same as those used in Example 1 to provide the top contact OTFT of the present example.

According to the present invention, whether an N-type OTFT or an ambipolar field-effect transistor is provided, either fullerene or PTCDI-C8 can be used to form the N-type organic semiconductor layer depending on the needs.

Example 7

Top Contact N-Type OTFT

Except that the fullerene material is replaced with PTCDI-C8 (N,N'-dioctyl-3,4,9,10-perylenedicarboximide), the other fabricating conditions and materials were the same as those used in Example 1 to provide the top contact N-type OTFT of the present example.

Evaluation of the Characteristics of the Top Contact N-Type OTFT

Figure 11:
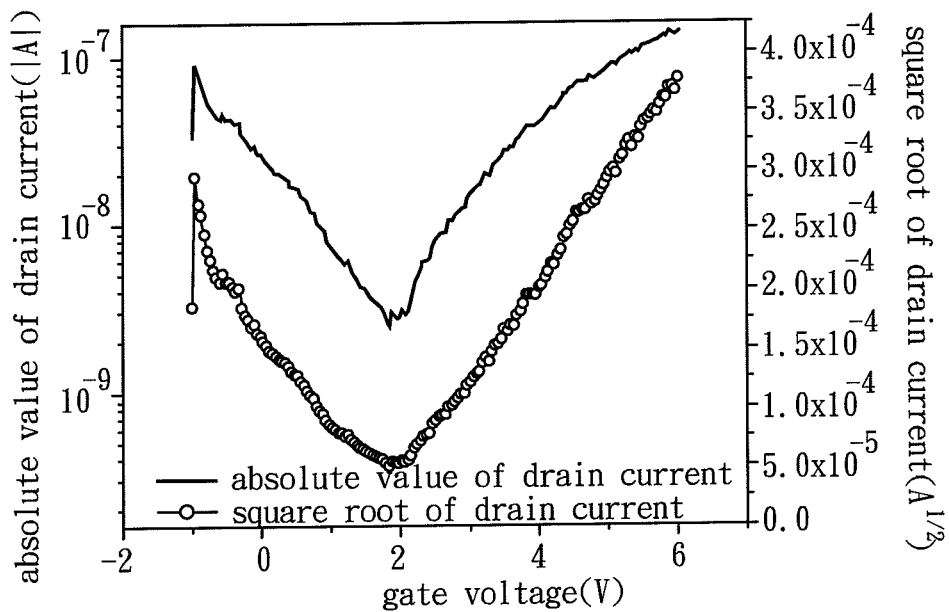
FIG. 11 is a curve showing the transfer characteristic of the top-contact N-type OTFT of Example 7 of the present invention.
Figure 12:
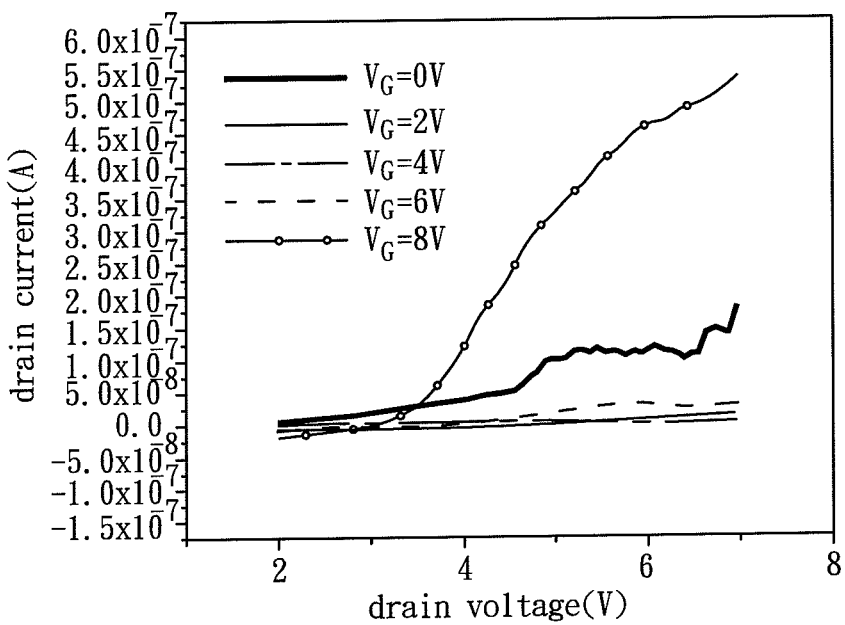
FIG. 12 is a curve showing the output characteristic of the top-contact N-type OTFT of Example 7 of the present invention.

A current-voltage test was performed on the top contact N-type OTFT of the present example. The result of the transfer characteristics of the N-type OTFT is shown in FIG. 11, and the result of the output characteristics under different gate voltage ($V_G$) is shown in FIG. 12. The electron mobility is about 0.06 cm²/Vs as listed in the following Table 1.

Example 8

Top Contact Ambipolar Field-Effect Transistor

Except that the fullerene material is replaced with PTCDI-C8, the other fabricating conditions and materials were the same as those used in Example 3 to provide the top contact ambipolar field-effect transistor of the present example.

Figure 13:
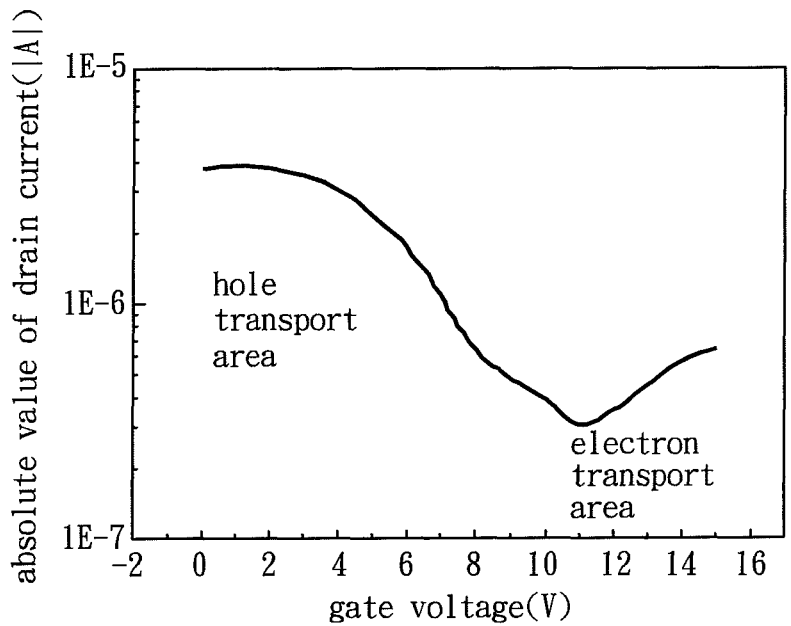
FIG. 13 is a curve showing the transfer characteristic of the top-contact ambipolar field-effect transistor of Example 8 of the present invention.
Figure 14:
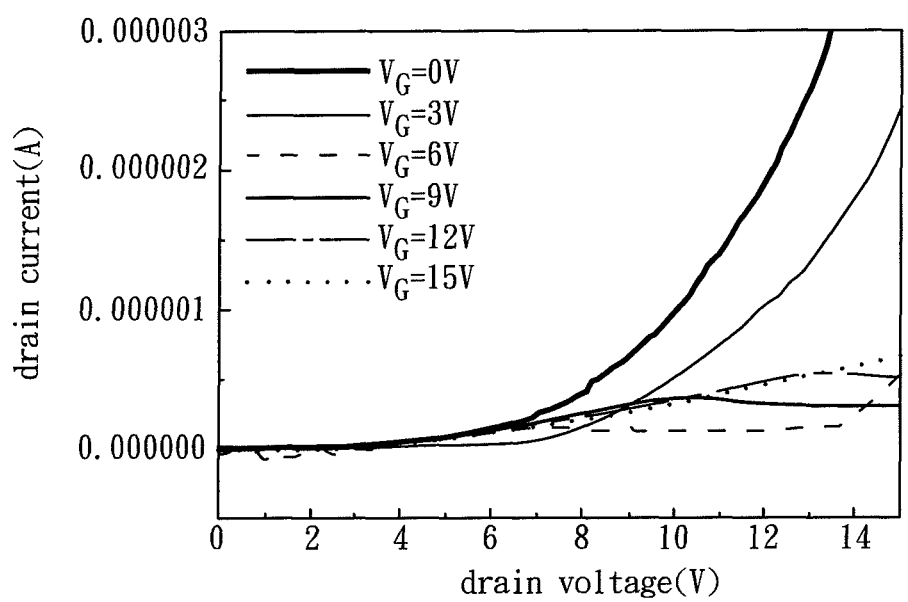
FIG. 14 is a curve showing the output characteristic of the top-contact ambipolar field-effect transistor of Example 8 of the present invention.

Evaluation of the Characteristics of the Top Contact Ambipolar Field-Effect Transistor A current-voltage test was performed on the ambipolar field-effect transistor of the present example. The result of the transfer characteristics of the ambipolar field-effect transistor is shown in FIG. 13, and the result of the output characteristics under different gate voltage ($V_G$) is shown in FIG. 14. The electron mobility is about 0.04 cm²/Vs, and the hole mobility is about 0.4 cm²/Vs as shown in the following Table 2.

Comparative Examples 1-2

The methods and materials as disclosed in journal 1 (Kenji Itaka,* Mitsugu Yamashiro, Jun Yamaguchi, Masamitsu Haemori, Seiichiro Yaginuma, Yuji Matsumoto, Michio Kondo, and Hideomi Koinuma, "High-Mobility $C_{60}$ Field-Effect Transistors Fabricated on Molecular-Wetting Controlled Substrates" Adv. Mater. 2006, 18, 1713-1716.) and journal 2 (Thomas D. Anthopoulosa_Birendra Singh, Nenad Marjanovic, Niyazi S. Sariciftci, Alberto Montaigne Ramil, Helmut Sitter, Michael Cölle and Dago M. de Leeuw, "High performance n-channel organic field-effect transistors and ring oscillators based on $C_{60}$ fullerene films", APPLIED PHYSICS LETTERS 89, 213504 (2006)) were used to fabricate the OTFT of Comparative Example 1-2, and the electrical characteristics are evaluated. The results are shown in the following Table 1.

TABLE 1

|  | Material of the gate insulating layer | Thickness of the gate insulating layer (nm) | Thickness of the N-type organic semiconductor layer (nm) | Substrate temperature during evaporation for forming the N-type organic semiconductor layer (° C.) | Thickness of the pentacene (buffering layer)(nm) | Substrate temperature during the evaporation process for forming the pentacene layer (° C.) | Electron mobility (cm2/Vs) |
|---|---|---|---|---|---|---|---|
| Example 1 | silk protein | about 400 | 60(fullerene) | 70 | 3 | 25 | about 11 |
| Example 7 | silk protein | about 400 | 55(PTCDI-C8) | 25 | 3 | 25 | about 0.06 |
| Comparative Example 1 | aluminum oxide | about 400 | 20 | 50 | 1.5 | 20 | 2-4.91 |
| Comparative Example 2 | Divinyltetra-methyldisiloxane-bis(benzocyclobutene) (BCB) | X | 300 | 100-250 | X | X | about 3-6 |

As shown in Table 1, aluminum oxide is used as the insulating layer in Comparative Example 1, and the obtained electron mobility is lower than that of Example 1 of the present invention. Besides, the OTFT of Comparative Example 1 is not flexible, has low stability and low reliability and therefore has relatively low commercial value.

As shown in Table 1, the OTFT of Comparative Example 2 has lower electron mobility than that of Example 1 of the present invention. Besides, the OTFT of Comparative Example 2 has low stability in air and is not flexible, and a high temperature is required during manufacturing (thus cannot be applied to flexible devices) and therefore has relatively low commercial value.

Comparative Example 3-4

The methods and materials disclosed in the above journals 1 and 2 were used to provide the ambipolar field-effect transistor of the present comparative examples 3-4, the electrical characteristics are evaluated and the results are shown in the following Table 2.

TABLE 2

|  | Material of the gate insulating layer | Thickness of the gate insulating layer (nm) | Thickness of the N-type organic semiconductor layer (nm) | Substrate temperature during the formation of N-type organic semiconductor layer (° C.) | Thickness of the pentacene (P-type organic semiconductor layer) (nm) | Substrate temperature during the formation of pentacene layer (° C.) | Electron mobility (cm²/Vs) | Hole mobility (cm²/Vs) |
|---|---|---|---|---|---|---|---|---|
| Example 3 | silk protein | about 400 | 40(fullerene) | 70 | 10 | 25 | about 6.9 | about 6.5 |
| Example 8 | silk protein | about 400 | 60(PTCDI-C8) | 75 | 25 | 25 | about 0.04 | about 0.4 |
| Comparative | aluminum | about 400 | 20 | 50 | 1.5 | 50 | 2-4.91 | X |

TABLE 2-continued

| | Material of the gate insulating layer | Thickness of the gate insulating layer (nm) | Thickness of the N-type organic semiconductor layer (nm) | Substrate temperature during the formation of N-type organic semiconductor layer (° C.) | Thickness of the pentacene (P-type organic semiconductor layer) (nm) | Substrate temperature during the formation of pentacene layer (° C.) | Electron mobility (cm$^2$/Vs) | Hole mobility (cm$^2$/Vs) |
|---|---|---|---|---|---|---|---|---|
| Example 3 Comparative Example 4 | oxide Divinyltetra-methyldisiloxane-bis(benzocyclobutene) (BCB) | X | 300 | 100-250 | X | X | about 3-6 | X |

As shown in Table 2, inorganic material-aluminum oxide is used as the insulating layer in Comparative Example 3, and the obtained electron mobility is lower than that of Example 3 of the present invention. Besides, the ambipolar field-effect transistor of Comparative Example 3 is not flexible, has low stability and low reliability and therefore has relatively low commercial value.

As shown in Table 2, the ambipolar field-effect transistor of Comparative Example 4 has lower electron mobility than that of Example 3 of the present invention. Besides, the ambipolar field-effect transistor of Comparative Example 4 has low stability in air and is not flexible, and a high temperature is required during the manufacturing (thus cannot be applied to flexible devices) and therefore has relatively low commercial value.

As mentioned above, in the present invention, silk protein is used in the insulating layer, which has advantages such as: (1) the electron mobility can be increased; (2) a flexible transistor can be realized; and (3) a high stability can be obtained. The present invention uses silk protein as the gate-insulating layer, which can improve the crystalline properties of the pentacene thin film and improve the electron mobility of N-type OTFTs and/or ambipolar field-effect transistors, and can be applied to flexible electronics. Furthermore, the present invention is the first one using flexible silk protein in the N-type $C_{60}$ OTFT and/or ambipolar field-effect transistors in the related field.

Silk protein is flexible and cheap so can serve as an excellent insulating layer in flexible electronic devices. The present invention uses silk protein as the gate-insulating layer with pentacene (as the buffering layer and/or P-type organic semiconductor layer) and uses other materials such as fullerene, PTCDI-C8 (n,n'-dioctyl-3,4,9,10-perylenedicarboximide), or similar materials that can be used in N-type OTFT and/or ambipolar field-effect transistors to provide N-type OTFTs and/or ambipolar field-effect transistors. The OTFT and/or ambipolar field-effect transistors provided by the present invention have very good electric characteristics and can be applied to a wide variety of flexible electronics such as complementary metal oxide semiconductors (CMOS) or organic light emitting transistors (OLET), and therefore the OTFT and/or ambipolar field-effect transistors of the present invention have very high economic value.

Fullerene ($C_{60}$) is a material that is sensitive to humidity and oxygen, and therefore in the prior arts, testing processes for electronics made with $C_{60}$ are usually performed under a nitrogen atmosphere or in a vacuum condition to avoid the influence of humidity or oxygen. The N-type OTFT of the present invention has excellent stability; the measured electron mobility is about 7-15 cm$^2$/Vs even though the N-type OTFT of the present invention is tested in ambient air (without nitrogen atmosphere nor in a vacuum condition); and the ambipolar field-effect transistor of the present invention has an electron mobility of about 4 cm$^2$/Vs-13 cm$^2$/Vs. Therefore, it is proved that the N-type OTFT and/or the ambipolar field-effect transistor of the present invention is air-stable and has a high commercial value.

Although the present invention has been explained in relation to its preferred example, it is to be understood that many other possible modifications and variations can be made without departing from the spirit and scope of the invention as hereinafter claimed.

What is claimed is:

1. An N-type organic thin film transistor, which comprises:
   a substrate;
   a gate electrode locating on the substrate;
   a gate-insulating layer covering the gate electrode, and the gate-insulating layer is made of silk protein;
   a buffering layer locating on the gate-insulating layer, and the buffering layer is made of pentacene;
   an N-type organic semiconductor layer locating on the buffering layer; and
   a source electrode and a drain electrode,
   wherein the N-type organic semiconductor layer, the buffering layer, the source electrode and the drain electrode are disposed over the gate dielectric layer.

2. The N-type organic thin film transistor as claimed in claim 1, wherein the silk protein is fibroin.

3. The N-type organic thin film transistor as claimed in claim 1, wherein the gate-insulating layer has a single-layer structure or has a multi-layered structure.

4. The N-type organic thin film transistor as claimed in claim 1, wherein the material of the N-type organic semiconductor layer is selected from a group consisting of fullerene ($C_{60}$) and PTCDI-C8 (N,N'-dioctyl-3,4,9,10-perylenedicarboximide).

5. The N-type organic thin film transistor as claimed in claim 1, wherein the thickness of the buffering layer is 1 nm to 20 nm, and the thickness of the N-type organic semiconductor layer is 10 nm to 150 nm.

6. The N-type organic thin film transistor as claimed in claim 4, wherein the electron mobility of the N-type organic thin film transistor is 7 cm$^2$/Vs to 15 cm$^2$/Vs when the N-type organic semiconductor layer is made of fullerene ($C_{60}$).

7. The N-type organic thin film transistor as claimed in claim 1, wherein the thickness of the gate-insulating layer is 100 nm to 800 nm.

8. The N-type organic thin film transistor as claimed in claim 1, wherein the N-type organic semiconductor layer covers the entire surface of the buffering layer, the buffering layer covers the entire surface of the gate-insulating layer, and the source electrode and the drain electrode locate on the N-type organic semiconductor layer, when the N-type organic thin film transistor is a top contact N-type organic thin film transistor.

9. The N-type organic thin film transistor as claimed in claim 1, wherein the source electrode and the drain electrode locate between the buffering layer and the gate-insulating layer, the buffering layer covers part of the gate-insulating layer, the source electrode and the drain electrode, when the N-type organic thin film transistor is a bottom contact N-type organic thin film transistor.

10. The N-type organic thin film transistor as claimed in claim 1, wherein the substrate is one selected from a group consisting of: a plastic substrate, a glass substrate, a quartz substrate, a silicon substrate, and a paper substrate.

* * * * *